US012610666B2

(12) United States Patent
Matano et al.

(10) Patent No.: US 12,610,666 B2
(45) Date of Patent: Apr. 21, 2026

(54) GLASS FOR USE IN WAVELENGTH CONVERSION MATERIAL, WAVELENGTH CONVERSION MATERIAL, WAVELENGTH CONVERSION MEMBER, AND LIGHT-EMITTING DEVICE

(71) Applicant: NIPPON ELECTRIC GLASS CO., LTD., Otsu (JP)

(72) Inventors: Takahiro Matano, Otsu (JP); Tamio Ando, Otsu (JP); Yoshihisa Takayama, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 34 days.

(21) Appl. No.: 18/372,938

(22) Filed: Sep. 26, 2023

(65) Prior Publication Data

US 2024/0014357 A1      Jan. 11, 2024

Related U.S. Application Data

(63) Continuation of application No. 16/638,784, filed as application No. PCT/JP2018/031040 on Aug. 22, 2018, now Pat. No. 11,804,577.

(30) Foreign Application Priority Data

Sep. 27, 2017      (JP) ................................. 2017-185994

(51) Int. Cl.
$H10H\ 20/851$      (2025.01)
$C03C\ 3/093$      (2006.01)

(52) U.S. Cl.
CPC ......... $H10H\ 20/8513$ (2025.01); $C03C\ 3/093$ (2013.01)

(58) Field of Classification Search
None
See application file for complete search history.

(56) References Cited

U.S. PATENT DOCUMENTS 3,784,386 A    1/1974   Araujo et al.
5,610,108 A    3/1997   Watzke et al.
(Continued)

FOREIGN PATENT DOCUMENTS

CN        1850683 A    10/2006
DE   102005000663 A1   11/2006

OTHER PUBLICATIONS

Matano et al., "Glass for Use in Wavelength Conversion Material, Wavelength Conversion Material, Wavelength Conversion Member, and Light-Emitting Device", U.S. Appl. No. 16/638,784, filed Feb. 13, 2020.

(Continued)

*Primary Examiner* — Sarah K Salerno
(74) *Attorney, Agent, or Firm* — Keating & Bennett, LLP

(57) ABSTRACT

Provided is a glass that is used in a phosphor-containing wavelength conversion material and from which can be produced a wavelength conversion member less degraded in characteristics of a phosphor owing to firing during production of the wavelength conversion member and having excellent weather resistance. The glass is for use in a wavelength conversion material and contains, in terms of % by mass, 30 to 75% $SiO_2$, 1 to 30% $B_2O_3$, over 4 to 20% $Al_2O_3$, 0.1 to 10% $Li_2O$, 0 to below 9% $Na_2O+K_2O$, and 0 to 10% $MgO+CaO+SrO+BaO+ZnO$.

8 Claims, 1 Drawing Sheet

(56)  References Cited

U.S. PATENT DOCUMENTS

| | | | |
|---|---|---|---|
| 2006/0006786 A1 | 1/2006 | Fechner et al. | |
| 2006/0009343 A1 | 1/2006 | Fechner et al. | |
| 2006/0010917 A1 | 1/2006 | Fechner et al. | |
| 2006/0120105 A1 | 6/2006 | Fechner et al. | |
| 2010/0045164 A1 | 2/2010 | Fechner et al. | |
| 2016/0225966 A1* | 8/2016 | Maloney | C03C 4/12 |
| 2017/0334765 A1* | 11/2017 | Wada | C03C 3/083 |
| 2019/0144329 A1* | 5/2019 | Inaka | C03C 3/091 |
| | | | 428/220 |

OTHER PUBLICATIONS

Official Communication issued in corresponding European Patent Application No. 18861489.5, mailed on Oct. 29, 2024, 4 pages.

* cited by examiner

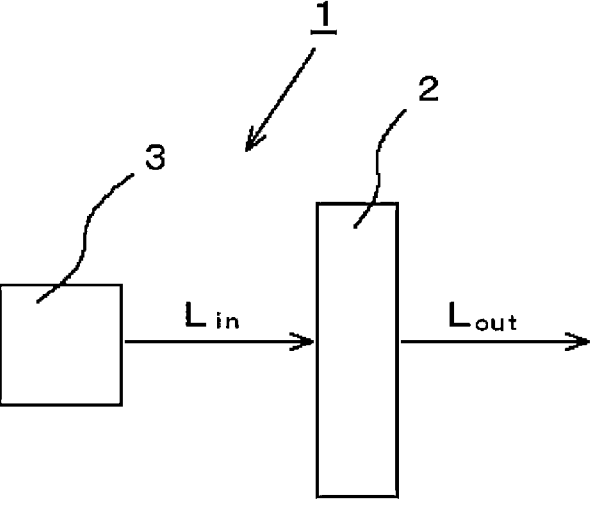

GLASS FOR USE IN WAVELENGTH CONVERSION MATERIAL, WAVELENGTH CONVERSION MATERIAL, WAVELENGTH CONVERSION MEMBER, AND LIGHT-EMITTING DEVICE

TECHNICAL FIELD

The present invention relates to glasses for use to produce wavelength conversion members for converting the wavelength of light emitted from a light emitting diode (LED), a laser diode (LD) or the like to another wavelength.

BACKGROUND ART

Recently, attention has been increasingly focused on light sources and so on using LEDs or LDs, as next-generation light sources to replace fluorescence lamps and incandescent lamps. For example, Patent Literature 1 discloses, as an example of such a next-generation light source, a light source in which a wavelength conversion member is disposed on an LED for emitting a blue light and absorbs part of the light from the LED to convert it to a yellow light. This light source emits a white light which is a synthesized light of the blue light emitted from the LED and the yellow light emitted from the wavelength conversion member.

As a wavelength conversion member, there is conventionally used a wavelength conversion member in which a phosphor is dispersed in a resin matrix. However, with the use of such a wavelength conversion member, the problem arises that the light from an LED is likely to degrade the resin and thus decrease the luminance of the light source. Particularly, there is a problem that heat or high-energy short-wavelength (ultraviolet) light emitted from the LED or the phosphor degrades the molded resin to cause discoloration or deformation.

To cope with this, there are proposed wavelength conversion members formed of a fully inorganic solid in which a phosphor is dispersed and set in a glass matrix instead of resin (see, for example, Patent Literatures 2 and 3). These wavelength conversion members have the feature that the glass serving as the matrix is less likely to be degraded by heat and irradiation light from an LED chip and therefore less likely to cause the problem of discoloration and/or deformation.

CITATION LIST

Patent Literature

[PTL 1] JP-A-2000-208815
[PTL 2] JP-A-2003-258308
[PTL 3] JP-B2-4895541

SUMMARY OF INVENTION

Technical Problem

The wavelength conversion members described above have the problem that their phosphors are likely to be degraded by firing during production, thus easily deteriorating the luminance. Particularly, wavelength conversion members for use in general lightings, special lightings, and the like are required to have high color rendition and, therefore, need to use red phosphors having relatively low thermal resistance, so that the degradation of the phosphors tends to become significant.

On the other hand, if a low-softening point glass sinterable at a low temperature is used in order to solve the above problem, the resultant wavelength conversion member have poor weather resistance, which arises the problem that the use as a wavelength conversion member is limited.

Therefore, the present invention has an object of providing a glass that is used in a phosphor-containing wavelength conversion material and from which can be produced a wavelength conversion member less degraded in characteristics of a phosphor owing to firing during production of the wavelength conversion member and having excellent weather resistance.

Solution to Problem

A glass according to the present invention is a glass for use in a wavelength conversion material and contains, in terms of % by mass, 30 to 75% $SiO_2$, 1 to 30% $B_2O_3$, over 4 to 20% $Al_2O_3$, 0.1 to 10% $Li_2O$, 0 to below 9% $Na_2O+K_2O$, and 0 to 10% $MgO+CaO+SrO+BaO+ZnO$. As used herein, "$Na_2O+K_2O$" means the total amount of the respective contents of $Na_2O$ and $K_2O$ and "$MgO+CaO+SrO+BaO+ZnO$" means the total amount of the respective contents of MgO, CaO, SrO, BaO, and ZnO.

Since the glass according to the present invention contains 0.1% by mass or more $Li_2O$ as described above, it can easily achieve a low softening point. Therefore, the glass can be sintered at a low temperature, so that thermal degradation of a phosphor powder can be reduced. Furthermore, since the glass contains 30% by mass or more $SiO_2$, it has excellent weather resistance, so that degradation with time of a wavelength conversion member is less likely to progress. In addition, when the content of $SiO_2$ capable of increasing the transmittance in the ultraviolet region is controlled to 30% by mass or more and the content of alkali components capable of decreasing the transmittance in the ultraviolet region is controlled to less than 19% by mass, a high light transmittance in the ultraviolet region can be achieved.

The glass according to the present invention is preferably substantially free of a lead component and an arsenic component.

The lead component and the arsenic component are environmental load substances. Since the glass powder is formed to be substantially free of these components, an environmentally preferred wavelength conversion member can be provided. Note that "substantially free of" herein means that these components are not deliberately incorporated into the glass and does not mean to completely exclude even unavoidable impurities. Objectively, this means that the content of each of these components, inclusive of impurities, is less than by mass.

The glass according to the present invention preferably further contains, in terms of % by mass, 0 to 10% $ZrO_2$ and 0 to 5% $F_2$.

The glass according to the present invention preferably has a softening point of 750° C. or lower.

The glass according to the present invention preferably has a level of coloration $\lambda_{80}$ of 400 nm or less.

Note that in the present invention the level of coloration $\lambda_{80}$ refers to, on a light transmittance curve measured using a sample with a thickness of 10 mm, a shortest wavelength at which the sample reaches a light transmittance of 80%.

The glass according to the present invention is preferably in powdered form.

A wavelength conversion material according to the present invention contains the above-described glass and a phosphor.

In the wavelength conversion material according to the present invention, the phosphor is preferably at least one selected from nitride phosphor, oxynitride phosphor, oxide phosphor, sulfide phosphor, oxysulfide phosphor, halide phosphor, aluminate phosphor, barium magnesium aluminate-based phosphor, calcium halophosphate-based phosphor, alkaline-earth chloroborate-based phosphor, alkaline-earth aluminate-based phosphor, alkaline-earth silicon oxynitride-based phosphor, alkaline-earth magnesium silicate-based phosphor, alkaline-earth silicon nitride-based phosphor, and rare-earth oxychalcogenide-based phosphor.

A wavelength conversion member according to the present invention is made of a sintered body of the above-described wavelength conversion material.

A wavelength conversion member according to the present invention is a wavelength conversion member including a phosphor dispersed in a glass matrix, wherein the glass matrix contains, in terms of % by mass, 30 to 75% $SiO_2$, 1 to 30% $B_2O_3$, over 4 to 20% $Al_2O_3$, 0.1 to 10% $Li_2O$, 0 to below 9% $Na_2O+K_2O$, and 0 to 10% $MgO+CaO+SrO+BaO+ZnO$.

A light-emitting device according to the present invention includes the above-described wavelength conversion member and a light source operable to irradiate the wavelength conversion member with excitation light.

Advantageous Effects of Invention

The present invention enables provision of a glass that is used in a phosphor-containing wavelength conversion material and from which can be produced a wavelength conversion member less degraded in characteristics of a phosphor owing to firing during production of the wavelength conversion member and having excellent weather resistance.

BRIEF DESCRIPTION OF DRAWINGS

FIG. 1 is a schematic side view of a light-emitting device according to an embodiment of the present invention.

DESCRIPTION OF EMBODIMENTS

A glass according to the present invention is for use in a wavelength conversion material and contains, in terms of % by mass, 30 to 75% $SiO_2$, 1 to 30% $B_2O_3$, over 4 to 20% $Al_2O_3$. 0.1 to 10% $Li_2O$, 0 to below 9% $Na_2O+K_2O$, and 0 to 10% $MgO+CaO+SrO+BaO+ZnO$. Because the glass containing the above composition can be sintered at low temperature, the glass has the feature that when fired together with a phosphor, the phosphor is less likely to degrade and the glass is less likely to react with the phosphor. Furthermore, a wavelength conversion member obtained using the above glass has excellent weather resistance and light transmittance in the ultraviolet region, so that the degree of freedom of design for a light-emitting device using the wavelength conversion member can be increased and a highly reliable light-emitting device can be produced.

The reasons why the range of the glass composition is defined as above will be described below. Note that, in the following description of the respective contents of the components, "%" refers to "% by mass" unless otherwise specified.

$SiO_2$ is a component that forms a glass network and a component that significantly increases the light transmittance in the ultraviolet to visible region. Particularly, high-refractive index glass easily achieves the effect of increasing the light transmittance. Furthermore, $SiO_2$ is also a component that increases the weather resistance. The content of $SiO_2$ is 30 to 75%, preferably 35 to 70%, more preferably 40 to 65%, still more preferably 45 to 62.5%, and particularly preferably 45 to 60%. If the content of $SiO_2$ is too small, the above effects are less likely to be achieved. On the other hand, if the content of $SiO_2$ is too large, the sintering temperature becomes high, so that the phosphor is likely to degrade during firing.

$B_2O_3$ is a component that forms a glass network and a component that increases the light transmittance in the ultraviolet to visible region. Particularly, high-refractive index glass easily achieves the effect of increasing the light transmittance. The content of $B_2O_3$ is 1 to 30%, preferably 1.5 to 27.5%, more preferably 2 to 25%, and particularly preferably 2.5 to 20%. If the content of $B_2O_3$ is too small, the above effect is less likely to be achieved. On the other hand, if the content of $B_2O_3$ is too large, the sintering temperature becomes high, so that the phosphor is likely to degrade during firing.

$Al_2O_3$ is a component that forms a glass network and a component that increases the light transmittance in the ultraviolet to visible region. Particularly, high-refractive index glass easily achieves the effect of increasing the light transmittance. The content of $Al_2O_3$ is over 4 to 20%, more preferably 5 to 18%, still more preferably 6 to 16%, and particularly preferably 7 to 14%. If the content of $Al_2O_3$ is too small, the above effect is less likely to be achieved. On the other hand, if the content of $Al_2O_3$ is too large, the sintering temperature becomes high, so that the phosphor is likely to degrade during firing.

$Li_2O$ is a component that significantly lowers the softening point. The content of $Li_2O$ is 0.1 to 10%, preferably to 7.5%, and particularly preferably 1 to 5%. If the content of $Li_2O$ is too small, the above effect is less likely to be achieved. On the other hand, if the content of $Li_2O$ is too large, the weather resistance and refractive index are likely to decrease and the light transmittance is likely to decrease.

$Na_2O$ and $K_2O$ are components that lower the softening point. The content of $Na_2O+K_2O$ is 0 to below 9%, preferably 0.5 to 8%, and particularly preferably 1 to 7%. If the content of $Na_2O+K_2O$ is too large, the weather resistance and refractive index are likely to decrease and the light transmittance is likely to decrease.

The ranges of the respective contents of $Na_2O$ and $K_2O$ are as follows.

The content of $Na_2O$ is 0 to below 9%, preferably 0.5 to 7.5%, and particularly preferably 1 to 5%.

The content of $K_2O$ is 0 to below 9%, preferably 0.5 to 7.5%, and particularly preferably 1 to 5%.

MgO, CaO, SrO, BaO, and ZnO are components that act as a flux. These components also have the effect of suppressing devitrification and the effect of increasing the weather resistance. The content of $MgO+CaO+SrO+BaO+ZnO$ is 0 to 10%, preferably 0.1 to 9%, more preferably 0.5 to 8%, still more preferably 1 to 7%, yet still more preferably 1.5 to 6%, and particularly preferably 2 to 5%. The content of $MgO+CaO+SrO+BaO+ZnO$ is too large, the glass is likely to devitrify during forming and firing. In addition, the light transmittance is likely to decrease.

The ranges of the respective contents of MgO, CaO, SrO, BaO, and ZnO are as follows.

The content of MgO is 0 to 10%, preferably 0.1 to 9%, more preferably 0.5 to 8%, still more preferably 1 to 7%, yet still more preferably 1.5 to 6%, and particularly preferably 2 to 5%.

The content of CaO is 0 to 10%, preferably 0.1 to 9%, more preferably 0.5 to 8%, still more preferably 1 to 7%, yet still more preferably 1.5 to 6%, and particularly preferably 2 to 5%.

The content of SrO is 0 to 10%, preferably 0.1 to 9%, more preferably 0.5 to 8%, still more preferably 1 to 7%, yet still more preferably 1.5 to 6%, and particularly preferably 2 to 5%.

The content of BaO is 0 to 10%, preferably 0.1 to 9%, more preferably 0.5 to 8%, still more preferably 1 to 7%, yet still more preferably 1.5 to 6%, and particularly preferably 2 to 5%.

The content of ZnO is 0 to 10%, preferably 0.1 to 9%, more preferably 0.5 to 8%, still more preferably 1 to 7%, yet still more preferably 1.5 to 6%, and particularly preferably 2 to 5%.

The glass according to the present invention may contain, in addition to the above components, the following components.

$ZrO_2$ is a component that increases the weather resistance and a component that increases the refractive index. The content of $ZrO_2$ is preferably 0 to 10%, more preferably 0.1 to 7.5%, still more preferably 0.25 to 5%, and particularly preferably 0.5 to 3%. If the content of $ZrO_2$ is too large, the softening point is likely to increase, the resistance to devitrification is likely to deteriorate, and the liquid-phase viscosity is likely to decrease.

$F_2$ is a component that decreases the softening point. Furthermore, $F_2$ is a component that significantly increases the light transmittance in the ultraviolet region. The content of $F_2$ is preferably 0 to 5%, more preferably 0.1 to 4.5%, and particularly preferably 0.3 to 4%. If the content of $F_2$ is too large, the weather resistance and resistance to devitrification are likely to deteriorate.

$Nb_2O_5$ is a component that increases the weather resistance and a component that increases the refractive index. The content of $Nb_2O_5$ is preferably 0 to 20%, more preferably 0.1 to 15%, still more preferably 0.5 to 10%, and particularly preferably 1 to 5%. If the content of $Nb_2O_5$ is too large, the softening point is likely to increase and the light transmittance is likely to decrease.

$La_2O_3$ is a component particularly effective for the achievement of a high refractive index characteristic. The content of $La_2O_3$ is preferably 0 to 20%, more preferably 0.1 to 15%, still more preferably 0.5 to 10%, and particularly preferably 1 to 5%. If the content of $La_2O_3$ is too large, the softening point is likely to increase, the resistance to devitrification is likely to deteriorate, and the liquid-phase viscosity is likely to decrease.

$WO_3$ is a component that increases the refractive index. The content of $WO_3$ is preferably 0 to 20%, more preferably 0.1 to 15%, still more preferably 0.5 to 10%, and particularly preferably 1 to 5%. If the content of $WO_3$ is too large, the softening point is likely to increase and the light transmittance is likely to decrease.

$Y_2O_3$ has the effect of increasing the refractive index and also has the effect of increasing the weather resistance. The content of $Y_2O_3$ is preferably 0 to 5%, more preferably 0 to 4%, still more preferably 0 to 3%, and particularly preferably 0.1 to 2%. If the content of $Y_2O_3$ is too large, the glass is colored to decrease the light transmittance and the liquid-phase viscosity is likely to decrease.

When the glass contains a large amount (for example, ppm or more) of Fe component as an impurity, $TiO_2$ tends to significantly decrease the light transmittance and is likely to increase the softening point. Therefore, the content of $TiO_2$ is preferably 1% or less, more preferably 0.5% or less, and particularly preferably 0.1% or less.

Substantial incorporation of lead components (such as PbO) and arsenic components (such as $As_2O_3$) into the glass is preferably avoided for environmental reasons. Therefore, the glass is preferably substantially free of these components.

The softening point of the glass according to the present invention is preferably 750° C. or below, more preferably 748° C. or below, and particularly preferably 745° C. or below. If the softening point is too high, the sintering temperature of a wavelength conversion material containing the glass according to the present invention and a phosphor becomes high, so that the phosphor is likely to degrade during firing. Although no particular limitation is placed on the lower limit of the softening point, an excessively low softening point is likely to cause a deterioration in the weather resistance. Therefore, the softening point is preferably not lower than 400° C., more preferably not lower than 450° C., and still more preferably not lower than 500° C.

The level of coloration $\lambda_{80}$ of the glass according to the present invention is preferably 400 nm or less, more preferably 380 nm or less, and particularly preferably 360 nm or less. If the level of coloration $\lambda_{80}$ is too high, the glass tends to have a poor light transmittance in the ultraviolet to visible region. As a result, the amount of excitation light applied to the phosphor powder decreases and emitted light having a desired tint is difficult to obtain from the wavelength conversion member.

The coefficient of thermal expansion (at 30 to 300° C.) of the glass according to the present invention is preferably $30\times10^{-7}$ to $120\times10^{-7}/°$ C., more preferably $40\times10^{-7}$ to $110\times10^{-7}/°$ C., and particularly preferably $50\times10^{-7}$ to $100\times10^{-7}/°$ C. If the coefficient of thermal expansion is too low or too high, it does not match the coefficient of thermal expansion of a base material for fixing the wavelength conversion member or the coefficient of thermal expansion of an adhesive for bonding the wavelength conversion member and the base material together, so that the glass is likely to cause cracks when used at high temperatures.

Generally, most of phosphors have higher refractive indices than glass. If a wavelength conversion member has a large refractive index difference between its phosphor and glass matrix, excitation light is likely to be scattered at the interface between the phosphor and the glass matrix. As a result, the efficiency of irradiation to the phosphor with excitation light becomes high, so that the luminescence efficiency is likely to increase. However, if the refractive index difference between the phosphor and the glass matrix is too large, the scattering of excitation light becomes excessive, which causes a scattering loss and gives the wavelength conversion member a tendency to decrease the luminescence efficiency contrariwise. In view of the above, the refractive index (nd) of the glass according to the present invention is preferably 1.4 to 1.8, more preferably 1.42 to 1.75, and still more preferably 1.45 to 1.7. The refractive index difference between the phosphor and the glass matrix is preferably about 0.001 to about 0.5.

Next, a description will be given of an example of a method for producing the glass according to the present invention.

First, glass raw materials are formulated to give a desired composition and then melted in a glass melting furnace. In order to obtain a homogeneous glass, the melting temperature is preferably 1150° C. or higher, more preferably 1200° C. or higher, and particularly preferably 1250° C. or higher. In light of preventing the coloration of the glass due to penetration of Pt from platinum metal making a melting container, the melting temperature is preferably not higher than 1450° C., more preferably not higher than 1400° C., still more preferably not higher than 1350° C., and particularly preferably not higher than 1300° C.

Furthermore, if the melting time is too short, a homogeneous glass may not be obtained. Therefore, the melting time is preferably 30 minutes or longer and particularly preferably an hour or longer. However, in light of preventing the coloration of the glass due to penetration of Pt from the melting container, the melting time is preferably not longer than eight hours and particularly preferably not longer than five hours.

The molten glass may be poured into a mold to form it into a sheet or may be run through between a pair of cooling rollers to form it into a film. In obtaining a glass powder, the glass formed into a sheet or film is ground in a ball mill or by other means.

When, with the use of a powdered glass, it is mixed with a powdered phosphor and the mixture is fired, a wavelength conversion member with a phosphor uniformly dispersed in a glass matrix can be easily produced.

In the case where the glass according to the present invention is in powdered form (i.e., is a glass powder), its particle size is not particularly limited, but, for example, the maximum particle diameter Dmax is preferably 200 μm or less (particularly 150 μm or less and more preferably 105 μm or less) and the average particle diameter D50 is 0.1 μm or more (particularly 1 μm or more and more preferably 2 μm or more). If the maximum particle diameter Dmax of the glass powder is too large, excitation light is less likely to scatter in the resultant wavelength conversion member and, thus, the luminescence efficiency is likely to decrease. Furthermore, if the average particle diameter D50 is too small, excitation light excessively scatters in the resultant wavelength conversion member, so that the luminescence efficiency is likely to decrease.

Note that in the present invention the maximum particle diameter Dmax and the average particle diameter D50 refer to values measured by laser diffractometry.

The glass according to the present invention is used as a wavelength conversion material in combination with a phosphor.

No particular limitation is placed on the type of phosphor so long as it is available in the market. Examples include nitride phosphor, oxynitride phosphor, oxide phosphor (inclusive of garnet-based phosphor, such as YAG phosphor), sulfide phosphor, oxysulfide phosphor, halide phosphor (such as halophosphoric acid chloride phosphor), aluminate phosphor, barium magnesium aluminate-based phosphor, calcium halophosphate-based phosphor, alkaline-earth chloroborate-based phosphor, alkaline-earth aluminate-based phosphor, alkaline-earth silicon oxynitride-based phosphor, alkaline-earth magnesium silicate-based phosphor, alkaline-earth silicon nitride-based phosphor, and rare-earth oxychalcogenide-based phosphor. These phosphors are generally in powdered form. Among these phosphors, nitride phosphor, oxynitride phosphor, and oxide phosphor are preferred because they have high thermal resistance and are therefore relatively less likely to degrade during firing. Note that nitride phosphor and oxynitride phosphor have the feature that they convert near-ultraviolet to blue excitation light to a wide wavelength range of green to red light and additionally have relatively high luminescence intensity. Therefore, nitride phosphor and oxynitride phosphor are effective as phosphor particularly for use in a wavelength conversion member for a white LED device.

Examples of the above phosphor include those having an excitation band in a wavelength range of 300 to 500 nm and a luminescence peak at a wavelength of 380 to 780 nm and particular examples include those producing luminescence in blue (with wavelengths of 440 to 480 nm), those producing luminescence in green (with wavelengths of 500 to 540 nm), those producing luminescence in yellow (with wavelengths of 540 to 595 nm), and those producing luminescence in red (with wavelengths of 600 to 700 nm).

Examples of the phosphors that produce blue luminescence upon irradiation with ultraviolet to near-ultraviolet excitation light having a wavelength of 300 to 440 nm include $(Sr, Ba)MgAl_{10}O_{17}:Eu^{2+}$, $(Sr, Ba)_3MgSi_2O_8:Eu^{2+}$, $BaMgAl_{10}O_{17}:Eu^{2+}$, $(Ca, Sr, Ba)_5(PO_4)_3Cl:EU^{2+}$, $(Ca, Sr, Ba)_2B_5O_9Cl:Eu^{2+}$, $LaAl(Si_{6-z}Al_z)N_{10-z}O_z:Ce^{3+}$, and $(Sr_{1-x}, Ba_x)Al_2Si_3O_4N_4:Eu^{2+}$.

Examples of the phosphors that produce blue-green luminescence upon irradiation with ultraviolet to near-ultraviolet excitation light having a wavelength of 300 to 440 nm include $(Sr, Ca, Ba)Al_2O_4:Eu^{2+}$ and $(Sr, Ca, Ba)_4Al_{14}O_{25}:Eu^{2+}$.

Examples of the phosphors that produce green fluorescence upon irradiation with ultraviolet to near-ultraviolet excitation light having a wavelength of 300 to 440 nm include: $SrAl_2O_4:Eu^{2+}$; $SrBaSiO_4:Eu^{2+}$; $Y_3(Al, Gd)_5O_{12}:Ce^{3+}$; $SrSiO_n:Eu^{2+}$; $BaMgAl_{10}O_{17}:Eu^{2+}$, $Mn^{2+}$; $Ba_2MgSi_2O_7:Eu^{2+}$; $Ba_2SiO_4:Eu^{2+}$; $Ba_2Li_2Si_2O_7:Eu^{2+}$; $BaAl_2O_4:Eu^{2+}$; $(Mg, Ca, Sr, Ba)Si_2O_2N_2:Eu^{2+}$; and $(Ba, Ca, Sr)_2SiO_4:Eu^{2+}$.

Examples of the phosphors that produce red fluorescence upon irradiation with ultraviolet to near-ultraviolet excitation light having a wavelength of 300 to 440 nm include $(Mg, Ca, Sr, Ba)_2Si_5N_8:Eu^{2+}$ and $(Y, La, Gd, Lu)_2O_2S:Eu^{2+}$.

Examples of the phosphors that produce green fluorescence upon irradiation with blue excitation light having a wavelength of 440 to 480 nm include $SrAl_2O_4:Eu^{2+}$, $SrBaSiO_4:Eu^{2+}$, $Y_3(Al, Gd)_5O_{12}:Ce^{3+}$, $SrSiO_n:Eu^{2+}$, and $\beta$-SiAlON:Eu^{2+}$.

An example of the phosphor that produces yellow fluorescence upon irradiation with ultraviolet to near-ultraviolet excitation light having a wavelength of 300 to 440 nm is $La_3Si_6N_{11}:Ce^{3+}$.

Examples of the phosphors that produce yellow fluorescence upon irradiation with blue excitation light having a wavelength of 440 to 480 nm include $Y_3(Al, Gd)_5O_{12}:Ce^{3+}$ and $Sr_2SiO_4:Eu^{2+}$.

Examples of the phosphors that produce red fluorescence upon irradiation with ultraviolet to near-ultraviolet excitation light having a wavelength of 300 to 440 nm include: $CaGa_2S_4:Mn^{2+}$; $MgSr_3Si_2O_8:Eu^{2+}$, $Mn^{2+}$; and $Ca_2MgSi_2O_7:Eu^{2+}$, $Mn^{2+}$.

Examples of the phosphors that produce red fluorescence upon irradiation with blue excitation light having a wavelength of 440 to 480 nm include $CaAlSiN_3:Eu^{2+}$, $CaSiN_3:Eu^{2+}$, $(Ca, Sr)_2Si_5N_8:Eu^{2+}$, and $\alpha$-SiAlON:Eu^{2+}$.

A plurality of types of phosphors may be used in mixture according to the wavelength range of excitation light or luminescence. For example, in providing white light by irradiation with excitation light in the ultraviolet region, respective types of phosphors that produce blue, yellow, and red fluorescences may be used in mixture.

If the content of phosphor in the wavelength conversion member is too large, the wavelength conversion member has problems, such as: the phosphor is less likely to be efficiently irradiated with excitation light; and the mechanical strength of the wavelength conversion member is likely to decrease. On the other hand, if the content of phosphor is too small, a desired luminescence intensity is difficult to achieve. From these viewpoints, the content of phosphor in the wavelength conversion member is adjusted, in terms of % by mass, preferably in a range of 0.01 to 50%, more preferably in a range of 0.05 to 40%, and still more preferably in a range of 0.1 to 30%.

The above does not apply to a wavelength conversion member aimed at reflecting fluorescence generated in the wavelength conversion member toward the excitation light incident side thereof to mainly extract only the fluorescence to the outside, in the case of which the content of phosphor is made larger (for example, to, in terms of % by mass, preferably 50 to 80% and more preferably 55 to 75%) so that the luminescence intensity is maximized.

No particular limitation is placed on the wavelength conversion member according to the present invention so long as it is formed so that a phosphor is sealed in the glass. An example of the wavelength conversion member is one made of a sintered body of a glass powder and a phosphor powder. Alternatively, an example is a wavelength conversion member in which a phosphor is sandwiched between a plurality of (for example, two) glass plates. In this case, the plurality of glass plates are preferably fusion bonded together at their peripheral edges or sealed with a sealing material, such as glass frit.

The sintered body of a glass powder and a phosphor powder can be produced by roll-press forming. Specifically, a glass powder and a phosphor powder are mixed to obtain a mixed powder and the mixed powder is loaded between a pair of heating rollers. The mixed powder may be mixed with an inorganic filler for the purpose of increasing the mechanical strength and other purposes. The mixed powder is extruded in a direction of rotation of the rollers while being hot-pressed by the rollers. Thus, the mixed powder is formed into a sheet. According to this forming method, the heating time is short, so that thermal degradation of the phosphor can be suppressed. Furthermore, since the mixed powder is passed between the heating rollers, the glass powder is crushed while being softened, so that a dense sheet-shaped wavelength conversion member can be easily obtained. When a nanoparticulate phosphor is used as the phosphor, the particle size of the phosphor is small and the contact resistance of the phosphor particles against the rollers is therefore small, so that the formability is likely to increase. In addition, the contact resistance between the glass powder and the phosphor powder is small, so that the adhesion (sinterability) between the glass powder particles is likely to increase.

The size of the gap between the rollers can be appropriately selected according to the thickness of a desired sheet. The rotating speed of the rollers can be appropriately selected according to the type of the mixed powder, the temperature of the rollers, and so on.

The forming process can be performed, for example, in an atmosphere of air, nitrogen or argon. In light of reducing the deterioration of characteristics of the glass powder or phosphor, the forming is preferably performed in an inert gas, such as nitrogen or argon. Furthermore, the forming may be performed in a reduced-pressure atmosphere. When the forming is performed in a reduced-pressure atmosphere, the bubbles remaining in the wavelength conversion member can be reduced.

The method for producing the sintered body of a glass powder and a phosphor powder producing luminescence upon irradiation with ultraviolet light is not limited to roll-press forming. Specifically, a wavelength conversion material can be obtained by mixing a glass powder and a phosphor powder producing luminescence upon irradiation with ultraviolet light to obtain a mixed powder and then firing the mixed powder. The firing temperature is preferably the softening point of the glass powder or higher. Thus, a glass matrix in which the glass powder is fusion bonded together can be formed. If the firing temperature is too high, the inorganic phosphor powder producing luminescence upon irradiation with ultraviolet light may elute into the glass to decrease the luminescence intensity or components contained in the inorganic phosphor powder may diffuse into the glass to color the glass and thus decrease the luminescence intensity. Therefore, the firing temperature is preferably the softening point of the glass powder plus 150° C. or lower, and more preferably the softening point of the glass powder plus 100° C. or lower.

The firing is preferably performed in a reduced-pressure atmosphere. Specifically, the firing is preferably performed in an atmosphere of less than $1.013 \times 10^5$ Pa, more preferably in an atmosphere of not more than 1000 Pa, and still more preferably in an atmosphere of not more than 400 Pa. Thus, the amount of air bubbles remaining in the wavelength conversion member can be reduced. As a result, the scattering factor in the wavelength conversion member can be reduced to increase the luminescence efficiency. The whole firing process may be performed in a reduced-pressure atmosphere or only the firing may be performed in a reduced-pressure atmosphere and the heating and cooling steps before and after the firing may be performed in an atmosphere other than the reduced-pressure atmosphere (for example, under an atmospheric pressure).

There is no particular limitation as to the shape of the wavelength conversion member according to the present invention and examples include not only members having specific shapes of their own, such as platy, columnar, spherical, hemispherical, and hemispherical dome shapes, but also the shape of a coating formed on a base material surface of a glass substrate, a ceramic substrate or like substrate.

The wavelength conversion member obtained in the above manner is a wavelength conversion member including a phosphor dispersed in a glass matrix, wherein the glass matrix contains, in terms of % by mass, 30 to 75% $SiO_2$, 1 to 30% $B_2O_3$, over 4 to 20% $Al_2O_3$, 0.1 to 10% $Li_2O$, 0 to below 9% $Na_2O+K_2O$, and 0 to 10% $MgO+CaO+SrO+BaO+ZnO$.

FIG. 1 shows an embodiment of a light-emitting device according to the present invention. As shown in FIG. 1, the light-emitting device 1 includes a wavelength conversion member 2 and a light source 3. The light source 3 irradiates the wavelength conversion member 2 with excitation light Lin. The excitation light Li n having entered the wavelength conversion member 2 is converted to light having another wavelength and emits as L out from the opposite side of the wavelength conversion member 2 to the light source 3. At this time, synthesized light of the light having been converted and the excitation light having been not converted may be emitted.

EXAMPLES

The present invention will be described below in further detail with reference to examples, but the present invention is not limited to the following examples.

(1) Production of Glass

Tables 1 to 3 show glasses in working examples (Samples a to m) and comparative examples (Samples x and y).

TABLE 1

| Glass composition (% by mass) | a | b | c | d | e | f | g |
|---|---|---|---|---|---|---|---|
| $SiO_2$ | 60.1 | 60.5 | 60.3 | 62.0 | 60.4 | 66.1 | 55.0 |
| $B_2O_3$ | 19.7 | 19.9 | 17.5 | 15.0 | 19.7 | 20.5 | 22.0 |
| $Al_2O_3$ | 7.5 | 6.0 | 6.0 | 10.0 | 7.5 | 6.0 | 6.0 |
| $Li_2O$ | 2.2 | 3.3 | 4.0 | 6.0 | 2.2 | 1.5 | 2.0 |
| $Na_2O$ | 5.2 | 4.0 | 4.1 | 4.0 | 5.2 | 2.4 | 4.0 |
| $K_2O$ | 3.0 | | | | 3.0 | 1.6 | 1.0 |
| MgO | | 1.0 | 0.9 | | | | 2.0 |
| CaO | | 0.7 | 1.3 | | | | |
| SrO | | 1.4 | 1.8 | | | | 3.0 |
| BaO | 2.0 | | | 2.0 | 2.0 | 1.4 | |
| ZnO | | 1.1 | 0.4 | | | | 2.0 |
| $ZrO_2$ | | 1.0 | 1.9 | 1.0 | | | 2.0 |
| $F_2$ | 0.3 | 1.1 | 1.2 | | | 0.5 | 1.0 |
| $Na_2O + K_2O$ | 8.2 | 4.0 | 4.1 | 4.0 | 8.2 | 4.0 | 5.0 |
| $MgO + CaO + SrO + BaO + ZnO$ | 2.0 | 4.2 | 4.4 | 2.0 | 2.0 | 1.4 | 7.0 |
| Refractive index nd | 1.49 | 1.50 | 1.50 | 1.51 | 1.46 | 1.48 | 1.53 |
| Softening point (° C.) | 658 | 661 | 630 | 672 | 660 | 690 | 669 |
| Coloration $\lambda_{80}$ (nm) | 251 | 230 | 235 | 284 | 291 | 243 | 232 |
| CTE ($\times 10^{-7}/°$ C.) | 62 | 55 | 63 | 65 | 62 | 51 | 56 |
| Weather resistance | Good | Good | Good | Good | Good | Good | Good |

TABLE 2

| Glass composition (% by mass) | h | i | j | k | l | m |
|---|---|---|---|---|---|---|
| $SiO_2$ | 55.5 | 57.4 | 70.5 | 67.4 | 61.4 | 63.5 |
| $B_2O_3$ | 19.0 | 20.5 | 2.1 | 20.5 | 19.7 | 20.0 |
| $Al_2O_3$ | 9.5 | 14.0 | 8.6 | 5.5 | 7.5 | 6.8 |
| $Li_2O$ | 7.6 | 1.0 | 1.0 | 0.8 | 2.2 | 1.7 |
| $Na_2O$ | 4.0 | 3.8 | 4.0 | 2.4 | 5.2 | 4.3 |
| $K_2O$ | 2.4 | 1.6 | 4.9 | 1.6 | 3.0 | 2.5 |
| MgO | | | 2.0 | | | |
| CaO | | | | | | |
| SrO | | | | | | |
| BaO | 2.0 | 1.3 | 6.9 | 1.3 | 0.7 | 0.9 |
| ZnO | | | | | | |
| $ZrO_2$ | | | | | | |
| $F_2$ | | 0.4 | | 0.5 | 0.3 | 0.3 |
| $Na_2O + K_2O$ | 6.4 | 5.4 | 8.9 | 4.0 | 8.2 | 6.8 |
| $MgO + CaO + SrO + BaO + ZnO$ | 2.0 | 1.3 | 8.9 | 1.3 | 0.7 | 0.9 |
| Refractive index nd | 1.52 | 1.48 | 1.54 | 1.48 | 1.50 | 1.49 |
| Softening point (° C.) | 601 | 690 | 693 | 710 | 663 | 678 |
| Coloration $\lambda_{80}$ (nm) | 301 | 290 | 262 | 225 | 263 | 250 |
| CTE ($\times 10^{-7}/°$ C.) | 87 | 52 | 90 | 42 | 62 | 55 |
| Weather resistance | Good | Good | Good | Good | Good | Good |

TABLE 3

| Glass composition (% by mass) | x | y |
|---|---|---|
| $SiO_2$ | 71.3 | 28.2 |
| $B_2O_3$ | 13.1 | 28.3 |
| $Al_2O_3$ | 5.6 | 17.2 |
| $Li_2O$ | | 6.5 |
| $Na_2O$ | 6.0 | 5.0 |
| $K_2O$ | 2.0 | 3.0 |
| MgO | | 2.8 |
| CaO | 2.0 | 0.5 |
| SrO | | 1.5 |
| BaO | | 2.0 |
| ZnO | | 3.0 |
| $ZrO_2$ | | 1.0 |
| $F_2$ | | 1.0 |
| $Na_2O + K_2O$ | 8.0 | 8.0 |
| $MgO + CaO + SrO + BaO + ZnO$ | 2.0 | 9.8 |
| Refractive index nd | 1.53 | 1.62 |
| Softening point (° C.) | 785 | 601 |
| Coloration $\lambda_{80}$ (nm) | 295 | 420 |
| CTE ($\times 10^{-7}/°$ C.) | 54 | 96 |
| Weather resistance | Good | Poor |

First, raw materials were formulated to give each of the compositions shown in Tables 1 to 3. The raw materials were melted at 1300° C. in a platinum crucible for two hours to vitrify them and the molten glass was run through between a pair of cooling rollers to form it into a film. The obtained film-shaped glass was ground in a ball mill and classified, thus obtaining a glass powder having an average particle diameter D50 of 2.5 μm. Furthermore, part of the molten glass was cast in carbon mold forms to produce respective plate-shaped samples suitable for measurements.

The obtained samples were evaluated in terms of refractive index (nd), softening point, level of coloration, coefficient of thermal expansion (CTE) (at 30 to 300° C.), and weather resistance. The results are shown in the tables.

The refractive index is indicated by a value measured for the d-line (587.6 nm) of a helium lamp.

The softening point was measured using the fiber elongation method and the temperatures at which the viscosity reached $10^{7.6}$ dPa·s was employed as the softening point.

The level of coloration was measured in the following manner. An optically polished sample with a thickness of 10 mm±0.1 mm was measured in terms of light transmittance in a wavelength region of 200 to 800 nm at 0.5-nm intervals with a spectro-photometer to make a light transmittance curve. The shortest wavelength at which the sample indicated a light transmittance of 80% on the light transmittance curve was defined as the level of coloration $\lambda_{80}$.

The coefficient of thermal expansion (at 30 to 300° C.) was measured with a dilatometer.

The weather resistance was evaluated by holding a disc-shaped sample for evaluation with a diameter of 8 mm and a thickness of 1 mm for 300 hours under conditions of 121° C., 95% RH, and two atmospheres with a HAST tester PC-242HSR2 manufactured by Hirayama Manufacturing Corporation and observing the surface of the sample. Specifically, the samples having surfaces found to have no change between before and after the test as the result of microscopic observation were evaluated to be good as indicated by a "Good" sign, whereas the sample having a surface found to precipitate any glass component or lose its luster as the result of microscopic observation was evaluated to be no good as indicated by a "Poor" sign. Each sample for evaluation was produced by pressing the glass powder into a shape in a mold, firing the preform at a temperature 20° C. lower than the softening point shown in Tables 1 to 3, and then subjecting the fired product to processing, such as cutting and polishing.

As shown in Tables 1 to 3, Samples a to m, which were working examples, were good in the above characteristics. In contrast, Sample x, which was a comparative example, exhibited a softening point as high as 785° C. Sample y was poor in weather resistance and its level of coloration $\lambda_{80}$ was as high as 420 nm.

(2) Production of Wavelength Conversion Member

Tables 4 to 6 show wavelength conversion members in working examples (Nos. 1 to 13) and a comparative example (No. 14).

TABLE 4

| | | 1 | 2 | 3 | 4 | 5 | 6 | 7 |
|---|---|---|---|---|---|---|---|---|
| Glass powder LE (lm/W) | $BaMgAl_{10}O_{17}:Eu^{2+}$ | a 5.8 | b 5.9 | c 6.1 | d 5.7 | e 5.7 | f 5.9 | g 5.5 |
| | $\alpha$-SiAlON | 7.5 | 7.5 | 7.7 | 7.4 | 7.3 | 7.4 | 7.2 |

TABLE 5

| | | 8 | 9 | 10 | 11 | 12 | 13 |
|---|---|---|---|---|---|---|---|
| Glass powder LE (lm/W) | $BaMgAl_{10}O_{17}:Eu^{2+}$ | h 5.8 | i 5.5 | j 5.9 | k 6.2 | l 6.1 | m 6.0 |
| | $\alpha$-SiAlON | 7.6 | 7.3 | 7.5 | 7.9 | 7.9 | 7.7 |

TABLE 6

| | | 14 |
|---|---|---|
| Glass powder LE (lm/W) | $BaMgAl_{10}O_{17}:Eu^{2+}$ | X 2.9 |
| | $\alpha$-SiAlON | 4.2 |

Each of the glass powder samples shown in Tables 1 to 3 was mixed with $BaMgAl_{10}O_{17}:Eu^{2+}$ or $\alpha$-SiAlON as a phosphor powder so that the equation (glass powder):(phosphor powder)=80:20 (mass ratio) holds, thus obtaining a raw material powder for a wavelength conversion member. The raw material powder was pressed into a shape in a mold to produce a columnar preform having a diameter of 1 cm. The preform was fired at a temperature of the softening point of the glass powder plus 30° C. and the obtained sintered body was processed, thus obtaining a 8-mm diameter, 0.2-mm thick disc-shaped wavelength conversion member. The obtained wavelength conversion member was measured in terms of emission spectra and its luminous efficiency was calculated from the emission spectra. The results are shown in Tables 4 to 6.

The luminous efficiency was obtained in the following manner. The wavelength conversion member was placed above a light source having an excitation wavelength of 405 nm or 460 nm and the spectral energy distribution of light emitted from the top surface of the sample was measured in an integrating sphere. Next, the obtained spectra were multiplied by the standard spectral luminous efficiency function to calculate a total flux and the total flux was divided by the electric power of the light source to calculate the luminous efficiency.

As seen from Tables 4 to 6, in the cases where $BaMgAl_{10}O_{17}:Eu^{2+}$ was used as a phosphor powder and the samples were measured above a light source having a wavelength of 405 nm, the wavelength conversion members of Nos. 1 to 13, which were working examples, exhibited a luminous efficiency of 5.5 lm/W or more, whereas the wavelength conversion member of No. 14, which was a comparative example, exhibited a luminous efficiency as low as 2.9 lm/W.

Furthermore, in the cases where $\alpha$-SiAlON was used as a phosphor powder and the samples were measured above a light source having a wavelength of 460 nm, the wavelength conversion members of Nos. 1 to 13, which were working examples, exhibited a luminous efficiency of 7.2 lm/W or more, whereas the wavelength conversion member of No. 14, which was a comparative example, exhibited a luminous efficiency as low as 4.2 lm/W.

It can be considered that since the wavelength conversion members of Nos. 1 to 13 were produced using glass powder samples having excellent weather resistance, their surfaces are less likely to alter even after being used over a long period of time and their luminous efficiency is less likely to largely decrease.

INDUSTRIAL APPLICABILITY

The glass according to the present invention is suitable as a glass for a wavelength conversion member for use in a general lighting or a special lighting (for example, a projector light source or an on-vehicle headlight source), such as a monochromatic or white LED.

REFERENCE SIGNS LIST 1 light-emitting device
2 wavelength conversion member
3 light source

The invention claimed is:

1. A wavelength conversion member including a phosphor dispersed in a glass matrix, the glass matrix containing, in terms of % by mass, 55 to 75% $SiO_2$, 1 to 30% $B_2O_3$, 5.5 to 20% $Al_2O_3$, 0.1 to 10% $Li_2O$, 0 to 5% $Na_2O$, to 8% $Na_2O+K_2O$, 0.1 to 10% BaO, and 0.1 to 10% MgO+CaO+SrO+BaO+ZnO.

2. The wavelength conversion member according to claim 1, the glass matrix being substantially free of a lead component and an arsenic component.

3. The wavelength conversion member according to claim 1, the glass matrix further containing, in terms of % by mass, 0 to 10% $ZrO_2$ and 0 to 5% $F_2$.

4. The wavelength conversion member according to claim 1, the glass matrix having a softening point of 750° C. or lower.

5. The wavelength conversion member according to claim 1, the glass matrix having a level of coloration $\lambda_{80}$ of 400 nm or less.

6. The wavelength conversion member according to claim 1, wherein the phosphor is at least one selected from nitride phosphor, oxynitride phosphor, oxide phosphor, sulfide phosphor, oxysulfide phosphor, halide phosphor, and aluminate phosphor.

7. A light-emitting device comprising the wavelength conversion member according to claim 1 and a light source operable to irradiate the wavelength conversion member with excitation light.

8. A wavelength conversion member including a phosphor dispersed in a glass matrix, the glass matrix containing, in terms of % by mass, 55 to 75% $SiO_2$, 1 to 30% $B_2O_3$, 5.5 to 20% $Al_2O_3$, 0.1 to 10% $Li_2O$, 0 to 5% $Na_2O$, 0 to 8% $Na_2O+K_2O$, 0.1 to 4.4% BaO, and 0.1 to 4.4% MgO+CaO+SrO+BaO+ZnO.

* * * * *